(12) United States Patent
Park et al.

(10) Patent No.: US 9,028,923 B2
(45) Date of Patent: May 12, 2015

(54) COATING AND ION BEAM MIXING APPARATUS AND METHOD TO ENHANCE THE CORROSION RESISTANCE OF THE MATERIALS AT THE ELEVATED TEMPERATURE USING THE SAME

(75) Inventors: Jaewon Park, Daejeon (KR);
Chang-Kue Park, Daejeon (KR);
Jonghwa Chang, Daejeon (KR);
Byungho Choi, Daejeon (KR);
Yongwan Kim, Daejeon (KR)

(73) Assignee: Korea Atomic Energy Research Institute, Daejeon (KR)

( * ) Notice: Subject to any disclaimer, the term of this patent is extended or adjusted under 35 U.S.C. 154(b) by 87 days.

(21) Appl. No.: 13/365,692

(22) Filed: Feb. 3, 2012

(65) Prior Publication Data

US 2012/0135157 A1    May 31, 2012

Related U.S. Application Data

(62) Division of application No. 12/301,907, filed as application No. PCT/KR2006/004236 on Oct. 18, 2006, now abandoned.

(30) Foreign Application Priority Data

May 27, 2006    (KR) .................. 10-2006-0047855

(51) Int. Cl.
*C23C 14/16*        (2006.01)
*C23C 14/30*        (2006.01)
(Continued)

(52) U.S. Cl.
CPC ............ *C23C 14/5833* (2013.01); *C23C 14/48* (2013.01); *H01J 2237/3132* (2013.01);
(Continued)

(58) Field of Classification Search
CPC   C23C 14/0635; C23C 14/0682; C23C 14/24; C23C 14/30; C23C 14/46; C23C 14/48; C23C 14/505; C23C 14/5833; C23C 14/5893; H01J 2237/3132; H01J 2237/3142; H01J 2237/3146; H01J 2237/316; H01J 2237/3165; H01J 2237/31701
USPC ................. 427/523–531, 533, 566, 567, 427/249.17–249.19; 204/192.1–192.3; 148/222, 239
See application file for complete search history.

(56) References Cited

U.S. PATENT DOCUMENTS 4,256,780 A     3/1981  Gaerttner et al.
4,364,969 A *  12/1982  Dearnaley et al. ............ 148/525
(Continued)

FOREIGN PATENT DOCUMENTS

JP         59-074279 A      4/1984
JP         61-133376 A      6/1986
(Continued)

OTHER PUBLICATIONS

"PCT International Preliminary Report on Patentability dated Aug. 27, 2008 for related International Application No. PCT/KR2006/004236," 5 pgs.
(Continued)

*Primary Examiner* — Marianne L Padgett
(74) *Attorney, Agent, or Firm* — Fredrikson & Byron, P.A.

(57) ABSTRACT

The present invention relates to a ceramic coating and ion beam mixing apparatus for improving corrosion resistance, and a method of reforming an interface between a coating material and a base material. In samples fabricated using the coating and ion beam mixing apparatus, adhesiveness is improved, and the base material is reinforced, thereby improving resistance to thermal stress at high temperatures and high-temperature corrosion resistance of a material to be used in a sulfuric acid decomposition apparatus for producing hydrogen.

5 Claims, 12 Drawing Sheets

(51) Int. Cl.
  *C23C 14/48* (2006.01)
  *C23C 14/58* (2006.01)
  *C23C 14/06* (2006.01)
  *C23C 14/50* (2006.01)
  *H01J 37/317* (2006.01)
  *H01J 37/32* (2006.01)

(52) U.S. Cl.
  CPC ............ *C23C14/30* (2013.01); *C23C 14/5893* (2013.01); *C23C 14/0635* (2013.01); *H01J 2237/31701* (2013.01); *C23C 14/505* (2013.01); *H01J 37/317* (2013.01); *H01J 37/3233* (2013.01); *H01J 2237/316* (2013.01); *H01J 2237/3165* (2013.01)

(56) References Cited

U.S. PATENT DOCUMENTS

| | | | | |
|---|---|---|---|---|
| 4,759,948 | A | * | 7/1988 | Hashimoto et al. ............ 427/527 |
| 4,847,504 | A | | 7/1989 | Aitken |
| 4,933,058 | A | * | 6/1990 | Bache et al. ................ 204/192.3 |
| 4,992,298 | A | | 2/1991 | Deuchman et al. |
| 5,122,483 | A | * | 6/1992 | Sakai et al. .................... 438/787 |
| 5,374,318 | A | * | 12/1994 | Rabalais et al. .............. 428/469 |
| 5,391,407 | A | * | 2/1995 | Dearnaley .................... 427/527 |
| 5,593,719 | A | * | 1/1997 | Dearnaley et al. ........... 427/2.26 |
| 6,046,758 | A | * | 4/2000 | Brown et al. ................. 347/203 |
| 6,354,445 | B1 | | 3/2002 | Pritz |
| 6,383,345 | B1 | | 5/2002 | Kim et al. |
| 7,229,675 | B1 | * | 6/2007 | Paderov et al. .............. 427/529 |
| 7,629,031 | B2 | * | 12/2009 | Dornfest et al. ............. 427/535 |
| 7,838,083 | B1 | * | 11/2010 | Youchison et al. ........... 427/529 |
| 2003/0208912 | A1 | * | 11/2003 | Park et al. ...................... 30/350 |
| 2005/0064214 | A1 | | 3/2005 | Hultin Stigenberg et al. |
| 2005/0276990 | A1 | * | 12/2005 | Kohara et al. ................. 428/469 |
| 2006/0102466 | A1 | | 5/2006 | Kim |
| 2010/0051246 | A1 | * | 3/2010 | Kim et al. .................. 165/134.1 |

FOREIGN PATENT DOCUMENTS

| | | |
|---|---|---|
| JP | 01294861 A | 11/1989 |
| JP | 02-121367 A | 5/1990 |
| JP | 05-065637 A | 3/1993 |
| JP | 05-090253 A | 4/1993 |
| JP | 05-287531 A | 11/1993 |
| JP | 08119642 A | 5/1996 |
| KR | 1996-0032599 B1 | 4/1998 |

OTHER PUBLICATIONS

"PCT International Search Report dated Feb. 26, 2007 for related International Application No. PCT/KR2006/004236," 3 pgs.
Haynes International, High-Temperature Alloys, "Hastelloy X Alloy," 16 pages.
Toyo Tanso Carbon Products, "C/C Composite Products," 12 pages.
Special Metals, "Inconel Alloy X-750," 28 pages.
Sandvik, "Sanicro 28 (Tube and Pipe, Seamless)," 16 pages.
Special Metals, "Inconel Alloy 718," 28 pages.
Special Metals, "Inconel Alloy 690," 8 pages.
Special Metals, Incology Alloy 800H & 800HT, 16 pages.
Haynes International, High-Temperature Alloys, "Haynes 230 Alloy," 28 pages.
Haynes International, High-Temperature Alloys, "Haynes 556 Alloy," 28 pages.

* cited by examiner

COATING AND ION BEAM MIXING APPARATUS AND METHOD TO ENHANCE THE CORROSION RESISTANCE OF THE MATERIALS AT THE ELEVATED TEMPERATURE USING THE SAME

CROSS-REFERENCE TO RELATED APPLICATIONS

This application is a divisional application of U.S. application Ser. No. 12/301,907, filed Nov. 21, 2008, which is a 35 U.S.C. 371 national stage filing from International Application No. PCT/KR2006/004236 filed Oct. 18, 2006 and claims priority to Korean Patent Application No. 10-2006-0047855, filed on May 27, 2006, the teachings of all of which are incorporated herein by reference.

FIELD OF THE INVENTION

The present invention relates to a ceramic coating and ion beam mixing apparatus for improving corrosion resistance, and to a method of modifying an interface between a coating material and a base material.

BACKGROUND

Recently, according to the so-called green house effect, which is the result of carbon dioxide discharge, a global warming phenomenon is rapidly progressing, so that a serious natural disaster occurs, thereby the existence of human beings is threatened. Accordingly, human beings have become interested in hydrogen energy, which does not harm the environment, as a source of clean energy, and research and development into the clean energy has been focused on methods of economically producing hydrogen.

A process for thermochemically producing hydrogen referred to as an Iodine-Sulfur cycle is considered the most efficient of the methods of producing hydrogen. In the process, hydrogen is produced by thermally decomposing sulfuric acid using a high-temperature gas cooling furnace. The above process has been considered to be an influential method in that heat is stably supplied at a temperature of 950° C. or more and dangerousness is low. However, the selection of the material used in an apparatus for performing the process is becoming the most important issue. The reason is that a metal material must be used for high-temperature elasticity in the apparatus for the hydrogen producing process, but $SO_2$ and $SO_3$, generated at the time of thermally decomposing sulfuric acid, have extremely high corrosiveness, and thus it is difficult to establish an economical system using any metallic material that has been developed to date, and ceramic materials have excellent corrosion resistance but can be broken by thermal stress at high temperature, so that it is difficult to use such ceramic materials in the apparatus for the hydrogen producing process. Accordingly, a method of coating the ceramic to a metallic base material having an excellent thermal property at high temperature has been proposed.

However, generally, since ceramics and metals are different from each other in the thermal expansion, the thermal conductivity, and the like, they have poor adhesiveness with each other and thus are easily separated. One of the reasons is that, when a metal is exposed to an atmosphere with a high temperature, an oxide film is easily formed on the surface thereof, so that, when the metal is coated with different materials, the oxide film decreases adhesiveness therebetween.

While the present inventors researched methods of increasing adhesiveness between a metal base material and a ceramic thin film and maintaining high adhesiveness even at high temperature, they found that, when the ceramic is mixed with the metal materials at an interface therebetween using a so-called ion beam mixing method, which is a method of coating a metal base material with a ceramic thin film and then mixing the two different materials by radiating an ion beam, the adhesiveness is increased, and when a ceramic thin film is further applied to the mixed layer, the adhesiveness is maintained even at high temperatures, and the corrosion resistance at a high temperature is improved. As the result of the findings, the present inventors completed the present invention.

SUMMARY OF THE INVENTION

An object of the present invention is to provide a coating and ion beam mixing apparatus, which can perform a process of coating and ion beam mixing in a single reaction chamber to improve the adhesion at the interface between a metal base material and a ceramic coating layer.

Another object of the present invention is to provide a method of improving the adhesion at the interface between a metal base material and a coating layer using the coating and ion beam mixing apparatus.

In order to accomplish the above objects, the present invention provides a coating and ion beam mixing apparatus including, an electron gun 1 disposed in a reaction chamber 10 in a vacuum, a ceramic coating material container 3 located adjacent to the electron gun and irradiated with an electron beam generated from the electron gun 1, a metallic base material 5 fixed in an upper portion of the reaction chamber 10, one surface of which is coated with the coating material 4 melted and vaporized in the coating material container 3, a jig 8 mounted on the other surface of the base material and configured to rotate the base material 5 for homogenous deposition of the coating material 4, and an ion beam irradiation device 20 mounted on a side wall of the reaction chamber 10 and configured to mix the coating material 4 with the base material 5 at the interface therebetween to improve the adhesion of a coating layer.

Further, the present invention provides a method of improving the adhesion at the interface between a metallic base material and a ceramic coating layer using the coating and ion beam mixing apparatus, including melting and vaporizing the ceramic coating material by radiating an electron beam into a coating material container (step 1), applying the coating material, melted and vaporized in step 1, on a base material (step 2), and radiating an ion beam to mix the coating material with the base material coated in step 2 at the interface therebetween (step 3).

As described above, in the samples fabricated using the ceramic coating and ion beam mixing apparatus according to the present invention, the adhesion is improved, and the metallic base material is reinforced, thereby improving resistance to the thermal stresses at high temperatures and the high-temperature corrosion resistance of a material to be used in a sulfuric acid decomposition apparatus for producing hydrogen.

DESCRIPTION OF THE ELEMENTS IN THE DRAWINGS

Figure 1:
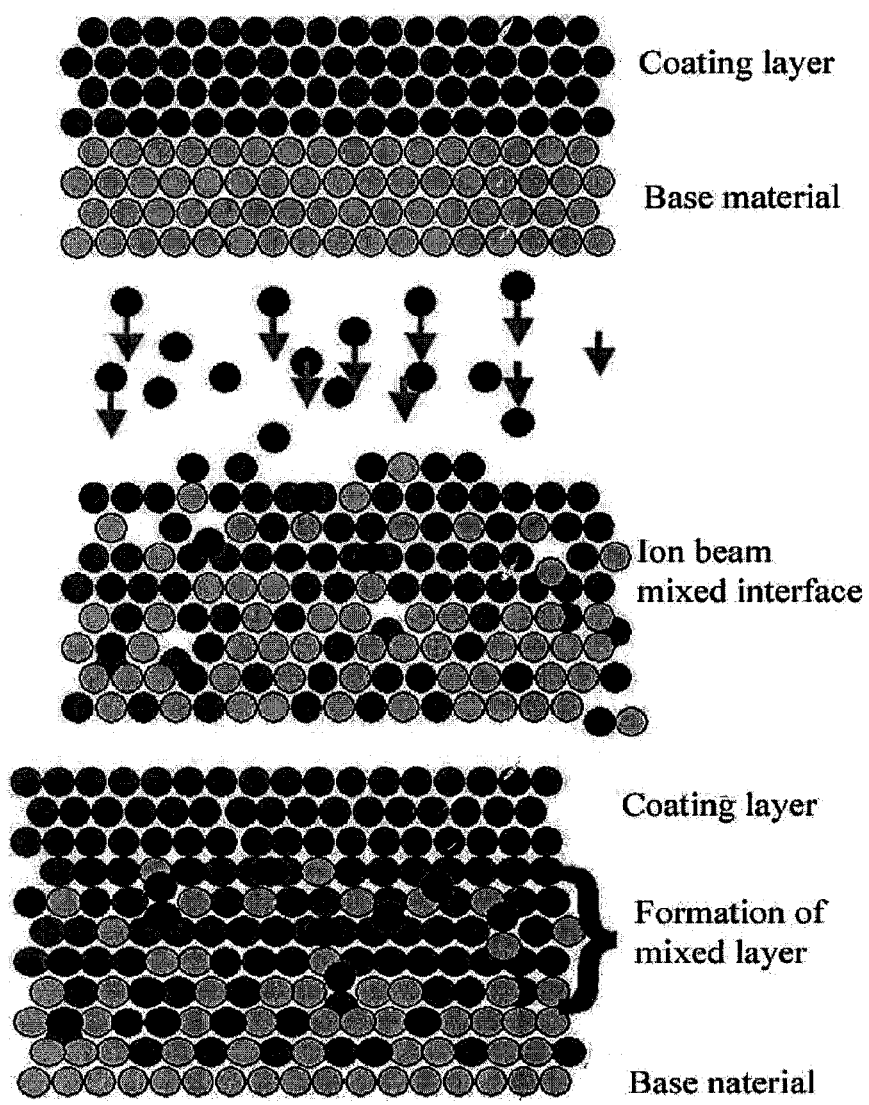
FIG. 1 is a view elucidating the general idea of coating and ion beam mixing according to the present invention.

1: electron gun
2: electron beam
3: ceramic container
4: melted and vaporized ceramic
5: base material
5': base material rotated to face ion beam irradiation inlet
6: ion beam irradiation inlet
8: jig
10: reaction chamber
20: ion beam irradiation device
21: ion source
22: ion beam accelerator
23: acceleration tube
24: gate valve

DETAILED DESCRIPTION OF PREFERRED EMBODIMENTS

Hereinafter, the present invention will be described with reference to the accompanying drawings.

FIG. 1 is a view elucidating the general idea of coating and ion beam mixing according to the present invention.

As shown in FIG. 1, when a thin coating layer is primarily formed on a base material and then an ion beam is radiated on the coating layer, ions collide with the coating layer, and thus energy is applied to the atoms of the coating layer, with the result that the atoms of the coating layer are pushed and simultaneously injected into the base material, and thus an ion beam mixing phenomenon occurs, thereby mixing the coating layer with the base material at the interface therebetween. Accordingly, the stress of the thin film is decreased and a new mixed layer is formed at the interface, thereby improving the sustainability of the thin film. Further, when a coating layer is additionally formed on the mixed layer, the coating layer is not easily peeled off from the base material because the coating layer is strongly adhered at the interface.

The term "ion beam mixing" used in the specification refers to a phenomenon whereby atoms of a coating material collide with an ion beam radiated thereto when ionized atoms having high energy collide with the surface of the coating material, and atoms of the coating material are then recoil-implanted. For this reason, the coating layer is mixed with the base material at the interface therebetween.

Variables pertinent to the ion beam mixing may include the coating material, the energy of the ion beam, and the quantity of ions injected. In the apparatus and method of the present invention, optimal conditions are provided by combining the variables.

Figure 2:
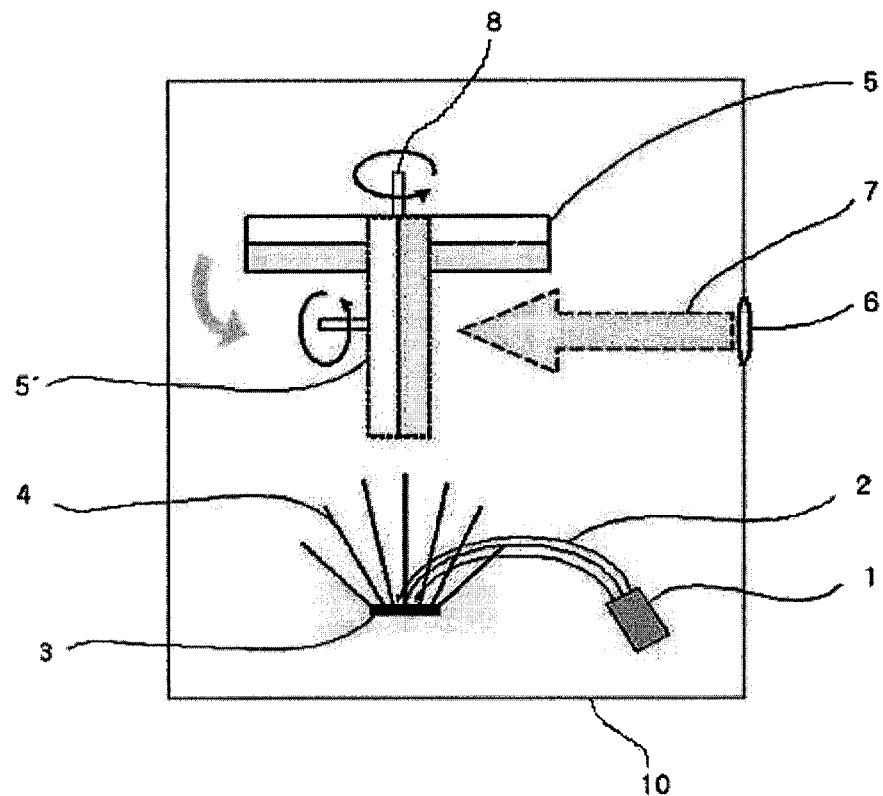
FIG. 2 is a schematic view of a coating and ion beam mixing apparatus according to an embodiment of the present invention.

FIG. 2 is a schematic view of a coating and ion beam mixing apparatus according to an embodiment of the present invention.

As shown in FIG. 2, the coating and ion beam mixing apparatus according to an embodiment of the present invention may include an electron gun 1 disposed in a reaction chamber 10 in a vacuum, a coating material container 3 located adjacent to the electron gun in the reaction chamber 10 and irradiated with an electron beam generated from the electron gun 1, a metallic base material 5 secured in an upper portion of the reaction chamber 10, one surface of which is coated with a ceramic coating material 4 melted and vaporized in the coating material container 3, a jig 8 mounted on the other surface of the base material and configured to rotate the base material 5 to uniformly deposit the coating material 4, and an ion beam irradiation device 20 mounted on a side wall of the reaction chamber 10 and configured to mix the coating material 4 with the base material 5 at the interface therebetween to improve the adhesiveness and compactness of a coating layer.

In the coating and ion beam mixing apparatus according to an embodiment of the present invention, it is preferred that the coating process and ion injection process be performed in one reaction chamber 10 in a vacuum.

Generally, when a metal material is exposed to the atmosphere, an oxide film is easily formed on the surface thereof. When the oxide film is coated with different materials, the oxide film decreases adhesiveness therebetween. Accordingly, it is preferred that the reaction chamber be in a vacuum state. Further, when the coating process and an ion beam process are independently performed in different reaction chambers in a vacuum, extraneous materials are attached to the coating layer during the movement of the sample, and this phenomenon is not preferable. Accordingly, it is preferred that the coating process and ion beam irradiation process be performed in a single reaction chamber in a vacuum in order to efficiently perform the processes.

In the coating and ion beam mixing apparatus according to an embodiment of the present invention, a ceramic material having a high thermal expansion coefficient and excellent corrosion resistance may be used as a coating material 4. In this case, it is preferred that SiC, $SiO_2$, $Al_2O_3$, $TiO_2$, etc. be used as the coating materials 4.

In the coating and ion beam mixing apparatus according to an embodiment of the present invention, the coating process may be performed using a physical vapor deposition method including a sputtering method or an evaporation method in order to apply a coating material on a base material 5.

The coating method may be performed using a Physical Vapor Deposition (PVD) method and a Chemical Vapor Deposition (CVD) method. The difference between the two methods may be the difference in process temperature. Specifically, in the physical vapor deposition method, the coating process can be performed at a process temperature of several hundreds of degrees C. or lower. In contrast, the chemical vapor deposition method is a coating method performed at a process temperature of about 1000° C. However, the coating method of the present invention is performed to apply the coating material on a base material 5. When the coating method of the present invention is performed using heat at a temperature as high as about 1000° C., the characteristics of the base material can change, therefore it is preferred that the coating process be performed using the physical vapor deposition method.

The physical vapor deposition method is a coating method in which a coating material is converted into gas and the gaseous material is then deposited, and includes a sputtering method or an evaporation method. Ultimately, there is no great difference in the characteristics of the surface modified base material resulting from the mixing process regardless of which of these methods is used. The sputtering method has an advantage in that a large coated area is easily performed if the target surface of a material for coating is large. In contrast, the evaporation method has an advantage in that it is possible to coat a large area using a small amount of material.

The kinetic energy of coating atoms is higher in the sputtering method than in the evaporation method, therefore the sputtering method has an advantage in that a relatively compact coating layer is formed. However, if an ion beam is radiated after the coating process is completed, this difference is almost overcome, and thus the evaporation method can be advantageous. However, it is apparent in the related arts that either of the two methods can be selected as necessary.

Moreover, in the coating and ion beam mixing apparatus according to an embodiment of the present invention, a metallic material having excellent mechanical properties at a temperature ranging from 300 to 900° C. may be used as a base material. In this case, metal allows, stainless steel and carbon composite may be used as the base material. For example, base materials can be metal alloys such as alloys having a Ni—Cr content or Ni—Cr—Fe content amongst other metals that may be present; stainless steel, and carbon composites. Examples of useful base materials include but are not limited to: Incoloy® Alloy 800H (commonly known as "Alloy 800H"), Inconel® Alloy 690 (commonly known as "Alloy 690"), Inconel® Alloy X-750 (commonly known as "Alloy X750"), Inconel® Alloy 718 (commonly known as "Alloy 718"), all available from Special Metals Corp; Hastelloy® X alloy (commonly known as "Alloy X" or "Hastelloy X"), Haynes® 230® alloy (commonly known as "Haynes 230"), Haynes® 556™ alloy (commonly known as "Haynes 556"), all available from Haynes International, Inc.; Scanicro 28™ alloy (commonly known as "Sanicro 28") available from Sandvik; stainless steel alloy; and CX 2002U carbon composite (commonly known as "CX-2002U") available from Toyo Tanso.

Further, the coating and ion beam mixing apparatus according to an embodiment of the present invention may include the jig 8 configured to be rotated, so that the coated surface of the base material 5 faces an ion beam irradiation inlet 6 thereby being exposed to an ion beam radiated from the ion beam irradiation device 20, after the surface of the base material 5 is completely coated.

Since the surface of a coating layer is made to face an ion beam irradiation inlet 6 by tilting the jig 8 holding the base material by a predetermined angle (see 5' in FIG. 1), the mixing process can be efficiently performed when the ion beam 7 is radiated on the surface of the coating layer.

Figure 3:
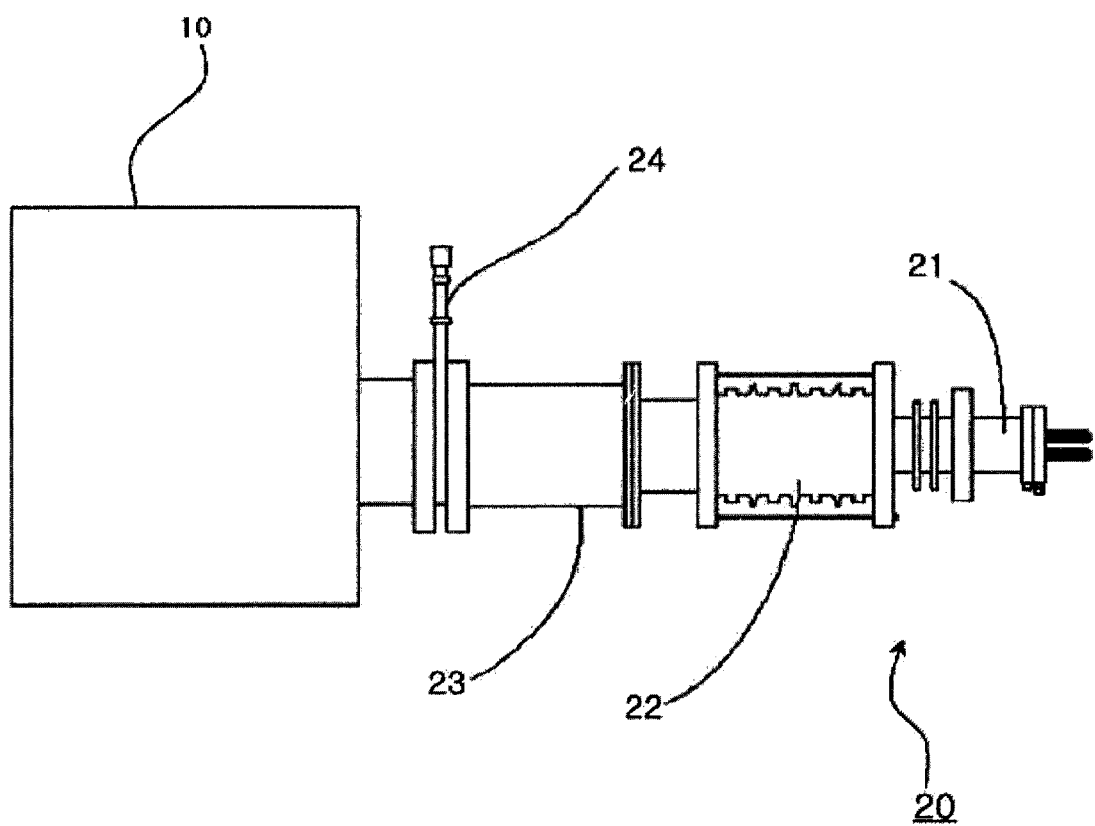
FIG. 3 is a schematic view of an ion beam irradiation device according to an embodiment of the present invention.

FIG. 3 is a schematic view of an ion beam irradiation device 20 according to an embodiment of the present invention.

As shown in FIG. 3, the coating and ion beam mixing apparatus according to an embodiment of the present invention may include the ion beam irradiation device 20 including an ion source 21 for generating an ion, an ion accelerator 22 for accelerating an ion discharged from the ion source 21, an acceleration tube 23 for enlarging the irradiation area of the ion beam, and a gate valve 24 mounted between the reaction chamber 10 and the ion beam irradiation device 20 to prevent the ion source 21 from being coated with the coating material.

In the coating and ion beam mixing apparatus according to an embodiment of the present invention, the element used in the ion beam irradiation device 20 depends on the difference between the composition of the base material 5 and the composition of the coating material 4.

In the case where the composition of the base material 5 is identical with the composition of the coating material 4, the element used in the ion beam irradiation device 20 may be independently selected from all elements in nature, or may be a mixture of the elements.

In contrast, in the case where the composition of the base material 5 is different from the composition of the coating material 4, the element used in the ion beam irradiation device 20 may be an element having a relatively small composition ratio among elements constituting the coating material 4. For example, in the case where the coating process uses SiC, the coating process is frequently performed using $SiC_{1-x}$ ($X \ll 1$), wherein the number of carbon atom is insufficient. Accordingly, in this case, if the carbon atom is used as an ion source 21 and is radiated on the coating material, the composition of the thin film can be complemented, and an ion beam mixing effect can be realized.

In the coating and ion beam mixing apparatus according to an embodiment of the present invention, it is preferred that carbon, nitrogen, oxygen, silicon, aluminum, helium, neon, argon, and titanium, or a mixture thereof be the element used in the ion beam irradiation device 20.

In the coating and ion beam mixing apparatus according to an embodiment of the present invention, the processes of coating and ion beam mixing may be performed by performing the coating and ion beam irradiation one time or several times in accordance with the characteristics of the coating material 4 and the base material 5.

In this case, in the processes of coating and ion beam irradiation, the coating may be performed several times as the difference in the thermal properties between the coating material 4 and the base material 5 increases. In this case, in the case where the coating is performed several times, the ion beam irradiation may be performed between the coating processes.

In the coating and ion beam mixing apparatus according to an embodiment of the present invention, the energy value and injection amount of the ion beam radiated from the ion beam irradiation device are adjusted depending on the thickness of each coating layer, coated one time or several times, thereby performing the process of coating and ion beam mixing.

In this case, it is preferred that the energy value of the ion beam range from 50 to 500 keV, and that the injection amount of the ion beam range from $1 \times 10^{17}$ to $1 \times 10^{18}$ ions/cm². Moreover, it is preferred that the thickness of each of the coating layers range from 20 to 200 nm.

Further, the present invention provides a method of improving an adhesion at the interface between a base material and a coating layer using the coating and ion beam mixing apparatus, including melting and vaporizing a coating material by radiating an electron beam into a coating material container (step 1), applying the coating material, melted and vaporized in step 1, on a base material (step 2), and radiating an ion beam to mix the coating material with the base material coated in step 2 at the interface therebetween (step 3).

In this case, the method of improving an adhesion at the interface between a base material and a coating layer using the coating and ion beam mixing apparatus may include a method of performing the most preferable among the coating methods and an interface mixing by efficiently combining the coating with the ion beam irradiation.

Hereinafter, each of the steps will be described in detail.

First, step 1 is a step of melting and vaporizing a coating material by radiating an electron beam into a coating material container.

In step 1, a material for coating is put into a coating material container 30 provided in the coating and ion beam mixing apparatus, an electron beam 2 is radiated from an electron gun located adjacent to the coating material container 3, the electron beam 2 is warped by a magnetic field applied thereto and thus reaches the center of the coating material container 3, a coating material 4 is melted and vaporized, and then the vapors of the coating material 4 reach the surface of a metal base material 5 secured to the upper portion of a reaction chamber, thereby coating the metal base material 5 with the vaporized coating material 4.

In this case, the coating material 4 may be selected from ceramic materials including SiC, $TiO_2$, $Al2O_3$, and the like.

Next, step 2 is a step of applying the coating material melted and vaporized in step 1 on a base material.

In this case, the jig 8 is provided on the surface of the base material 5 and the base material 5 is rotated during a deposition process in order to uniformly deposit the coating material 4 on the base material 5. The base material 5 can be deposited to a predetermined thickness due to the rotation thereof.

The base material 5 may be selected from the group consisting of metal alloys, stainless and carbon composites, e.g., Incoloy® Alloy 800H, Inconel® Alloy 690, Inconel® X-750, Inconel® Alloy 718, all available from Special Metals Corp; Hastelloy® X alloy, Haynes® 230® alloy, Haynes® 556™ alloy, all available from Haynes International, Inc., Scanicro 28™ alloy, available from Sandvik; stainless steel alloy; and cx 2002U carbon composite, available from Toyo Tanso.

Next, step 3 is a step of radiating an ion beam to mix the coating material with the base material coated in step 2 at the interface therebetween.

After the base material 5 is deposited to a predetermined thickness, the surface of the coating layer is made to face the ion beam irradiation inlet 6 by orienting the jig 8 holding the base material at a predetermined angle (see 5' in FIG. 1). The mixing process can be efficiently performed when the ion beam 7 is radiated on the surface of the faced coating layer.

All elements in nature may be used as the ion source 21 of the ion beam. However, since a ceramic material is generally formed of two or more elements, the composition of the coating layer can be different from that of the original ceramic material when the coating process is performed using the above mentioned deposition methods. In order to solve this problem, a specific element may be selected. For example, in the case where the coating process uses SiC, the coating process is frequently performed using $SiC_{1-x}$ (X<<1), wherein the number of carbon atoms is small. Accordingly, in this case, if carbon atoms are used as the ion source 21 and are radiated on the coating material, the composition of the thin film can be complemented and ion beam mixing effect can be realized. In contrast, in the case where the composition of the coating layer is identical with the composition of an original ceramic coating material, any element may be used as the ion source 21, but nitrogen atom may be used as the ion source 21 to improve the characteristics of the base material 5 which is in contact with an interface. Moreover, the element used as the ion source 21 may be independently used, or may be used by mixing these elements.

In this case, it is preferred that the energy value of the ion beam range from 50 to 500 keV, and that the injection amount of the ion beam range from $1\times10^{17}$ to $1\times10^{18}$ ions/cm². Moreover, it is preferred that the thickness of each of the coating layers range from 20 to 200 nm. When the injection amount of the ion beam is $1\times10^{17}$ ions/cm² or less, it is disadvantageous with respect to efficiency because the degree of mixing is low. In contrast, when the injection amount of the ion beam is $1\times10^{18}$ ions/cm² or more, the thin film in the coating process can be damaged by etching.

The method of improving adhesiveness and compactness at the interface between a base material and a coating layer using the coating and ion beam mixing apparatus may include a method of performing the more preferable of coating and interface mixing by efficiently combining coating with ion beam irradiation.

In the method of improving adhesiveness and compactness at the interface between a base material and a coating layer according to the present invention, it is preferred that the high-temperature thermal properties of the base material 5 and the coating material 4, which are finally selected, be similar to each other. For example, when SiC is selected as the coating material, Hastelloy X is most advantageously used as the base material 5. The reason is that the thermal properties of SiC and Hastelloy X, considering the thermal expansion coefficient and the elastic coefficient, are more similar to each other than the other materials combination, thermal stresses exerting at the interface therebetween is relatively low, and thus the likelihood of the peeling phenomenon is relatively low. However, when heat or external stress is applied between two different materials, the two different materials are easily separated from each other. Accordingly it is necessary to make the sharp interface therebetween dull. This problem can be overcome using a method including the steps of forming a primary thin coating and then mixing the two materials by radiating an ion beam 7, forming a secondary coating, further mixing the two materials with the layer mixed with the primary coating layer by further radiating an ion beam 7, and performing additional coating.

If necessary, the process of coating and ion beam irradiation may be repeatedly performed several times. In this case, the thickness of the coating layer can be adjusted in consideration of the characteristics of the ion beam energy and the base material 5. For example, the depth to which the element of the coating material is injected to the base material again due to the repulsion after collision with the ion beam irradiation is proportional to the energy of the ion. When the energy of the ion is constant, it is preferred that the thin film be thin, considering that the coating material is mixed with the base material 5. Accordingly, it is most preferable that the ion beam irradiation be performed between a coating process and a subsequent coating process, while the coating processes are performed several times. As a result, the two different materials are less sensitive to external stress because they have more properties in common at the interface therebetween.

Specifically, the ion beam generated from the ion source, such as argon, carbon, nitrogen or oxygen, which have energy of 50 to 500 keV, may be selectively radiated in accordance with the characteristics of the coating material and base material. The energy of the injected ion beam may be adjusted in accordance with the final thickness of the coating layer, and, when the coating process is performed several times, the thickness of each of the coating layers. However, when the coating layer is excessively thick, the mixing process using the ion irradiation may be impossible on the interface because the ion range may be within the coating layer. Therefore, it is preferred that the energy be adjusted such that it has a high energy state. In contrast, when the energy of the ion beam is low, the thickness of the coating layer must also be decreased. Generally, as the energy of the radiated ion beam is high or the amount of the radiated ion beam is large, the efficiency of mixing is increased. However, when the amount of the radiated ion beam is excessively large, the coating layer etc. is damaged due to the ion beam irradiation, and thus the opposite effect is produced, and the working cost is also increased, therefore it is preferred that the energy of the ion beam be adjusted to exhibit preferable physical properties and incur a suitable working cost. Accordingly, it is preferred that the injection amount of the ion beam range from $1 \times 10^{17}$ to $1 \times 10^{18}$ ions/cm$^2$. When the injection amount of the ion beam is $1 \times 10^{17}$ ions/cm$^2$ or less, this is advantageous with respect to efficiency, because the degree of mixing is low. In contrast, when the injection amount of the ion beam is above $1 \times 10^{18}$ ions/cm$^2$, a thin film in the coating process can be damaged by etching.

EXAMPLES

Hereinafter, the present invention will be described in detail based on Examples. However, the following Examples merely illustrate the present invention, and the present invention is not limited to the following Examples.

Example 1

Analysis of SiC Thin Film Coated Using an Ion Beam Deposition Method

An SiC thin film was melted and vaporized and was then deposited on Inconel 690 by applying an electric power of 10 kW using an electron beam evaporative deposition method, and then Auger depth profiling was performed. The results of the Auger depth profiling are shown in FIG. 4.

Figure 4:
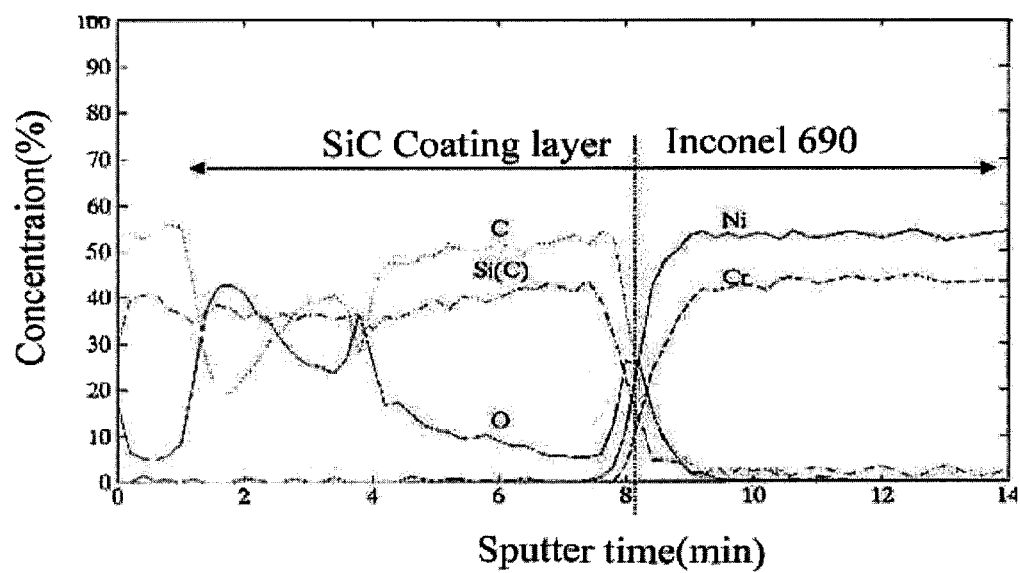
FIG. 4 is a graph showing the result of an auger depth profiling with respect to a SiC thin film deposited on the surface of Inconel according to an embodiment of the present invention.

As shown in FIG. 4, the SiC thin film was deposited on the surface of the Inconel 690, but the surface of the SiC thin film is covered with SiO$_2$, because the SiO$_2$ is easily formed, compared to the SiC. Therefore, difficulties in process control are likely to arise, because the coating process and the ion beam irradiation process are respectively performed in different reaction chambers, and it has been found that the coating process and the ion beam irradiation process must be performed in a single reaction chamber.

Experimental Example 1

Experiment on Change in Resistance of Thin Film to Sulfuric Acid Solution Corrosion by Ion Beam Irradiation Incoloy® Alloy 800H samples were cut to a size of 20 mm×20 mm×5 mm, the entire surfaces thereof were polished to an average surface roughness (Ra) of 50 nm or less, and then SiC was deposited thereon. Next, the samples were put into a sulfuric acid solution having a concentration of 50% at 300° C., and then were corroded for 1 hour, in a state in which test samples were irradiated with an ion beam, and the other samples were not irradiated with an ion beam. After 1 hour had passed, the surface contours of the samples were observed. The results thereof are shown in FIG. 5.

Figure 5:
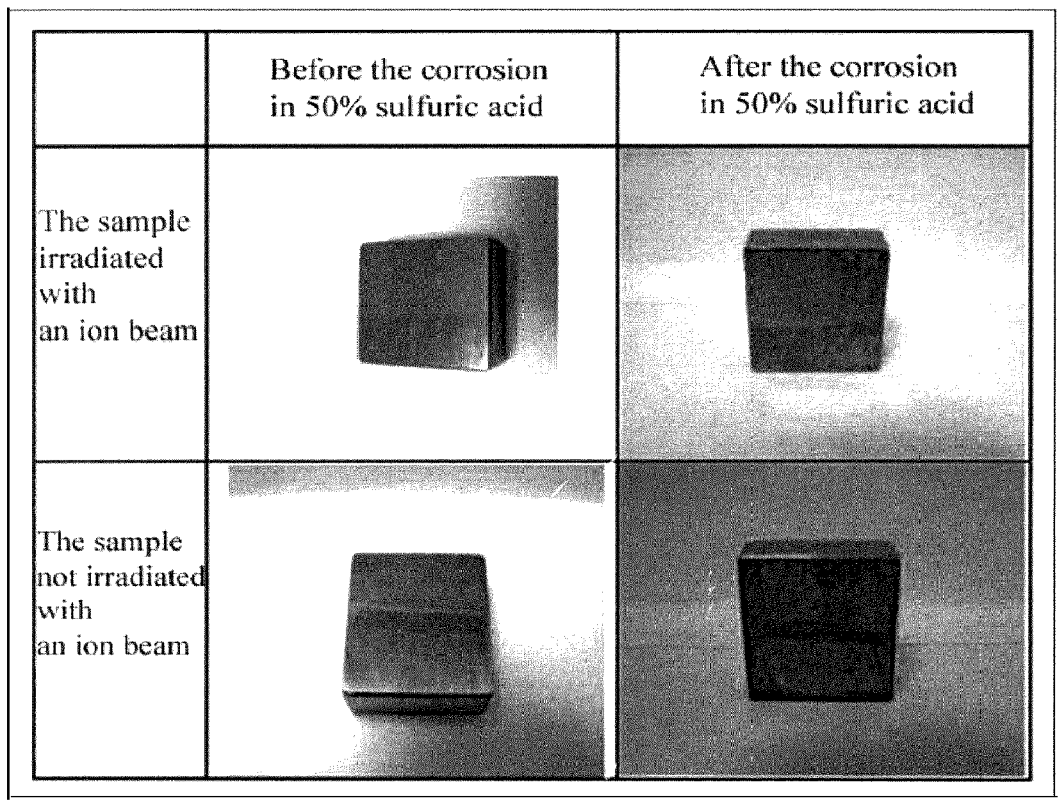
FIG. 5 is a view showing the surface contour of a sample that has been thin-coated by radiating an ion beam after corrosion of the sample according to an embodiment of the present invention.

As shown in FIG. 5, a thin film remains on the surface of the sample irradiated with an ion beam, but the thin film is almost peeled off of the surface of the sample not irradiated with the ion beam. The colors of the surface of sample appear to be different due to the difference in the thickness of the thin film. Even though the thickness is not uniform, the effect of ion beam irradiation is apparent.

Accordingly, it was found that, when the thin film is irradiated with the ion beam, the corrosion resistance thereof is improved.

Experimental Example 2

Experiment on Changes in Resistance to Electrical Etching of Thin Film Due to Ion Beam Irradiation A circular SiC thin film having a diameter of 20 mm was deposited on the surface of Hastelloy X, which has a size of 20 mm×20 mm×5 mm and is polished to a surface roughness of 50 nm or less. Next, in the state in which testing samples were irradiated with an ion beam, and the other samples were not irradiated with the ion beam, the thin film reaches the surface of a material not coated with electrodes, and was electrolytically etched by applying a voltage of 4 V and a current of 0.4 A. After the thin film was etched, the surface contours of the samples were observed. The results thereof are shown in FIG. 6.

Figure 6:
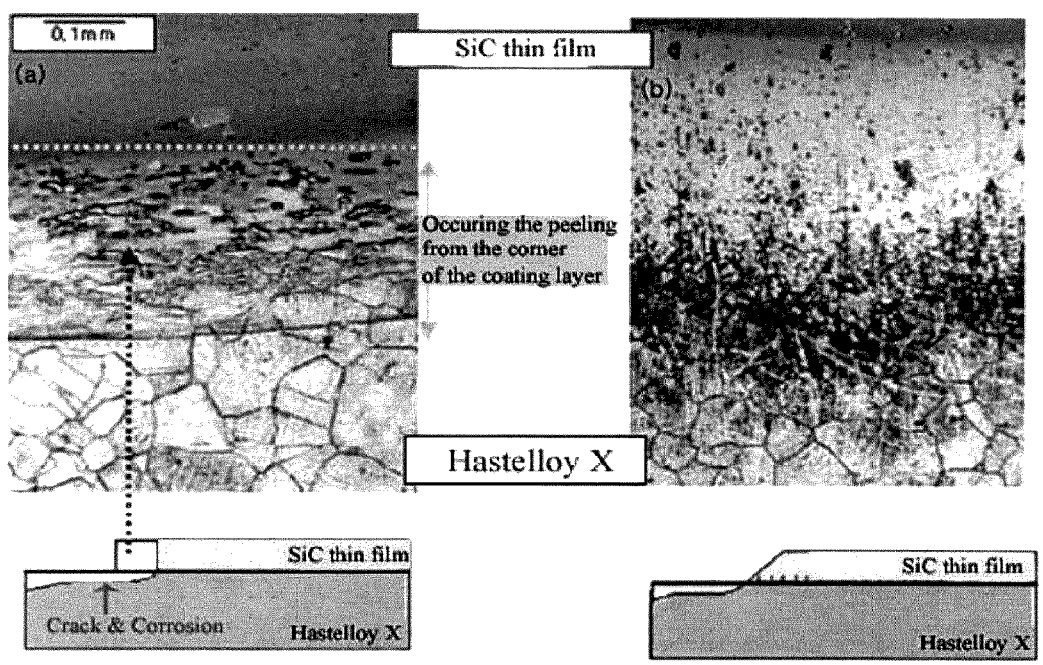
FIG. 6 is a view showing the surface contour of a sample that has been thin-coated by radiating an ion beam after the electrolytic etching of the sample according to an embodiment of the present invention.

As shown in FIG. 6, in the sample not irradiated with the ion beam, a peeling phenomenon in the shape of flakes occurred at the corners of the coating layer of the sample. However, in the sample irradiated with an ion beam, the thin film was spread and the peeling phenomenon in the shape of flakes was not observed. Meanwhile, in the sample irradiated with an ion beam, it was found that the corrosion resistance of the base material located beneath the thin film was improved due to the effect of ion beam irradiation or ion beam mixing.

Experimental Example 3

>Auger Si Mapping at the Interface Between a SiC Thin Film and a Base Material Before and after Ar Ion Beam Irradiation When an Ar ion beam is radiated on a thin film, the following experiment was performed using auger mapping to detect the mixing phenomenon at the interface between the thin film and the base material.

A circular SiC thin film having a diameter of 20 mm was deposited on the surface of Hastelloy X, which has a size of 20 mm×20 ml×5 mm and is polished to a surface roughness of 50 nm or less. Next, comparison samples were not irradiated with an Ar ion beam, and testing samples were irradiated with an Ar ion beam. Then, an element distribution in the interface was mapped using the auger mapping. The results thereof are shown in FIGS. 7 and 8.

Figure 7:
FIG. 7 is a photograph of the mapping of the Si element distribution at the interface of a sample coated only with SiC without the Ar ion beam radiated.

FIG. 7 is a photograph of the mapping of the Si element distribution at the interface of a sample coated only with SiC without the Ar ion beam radiated. In the photograph, the part in which the Si element exists is indicated in white, and the other part, which is a base material, in which there is no Si element, is indicated in black. As shown in FIG. 7, in the sample coated only with SiC, the Si element does not appear to have infiltrated into the base material.

Figure 8:
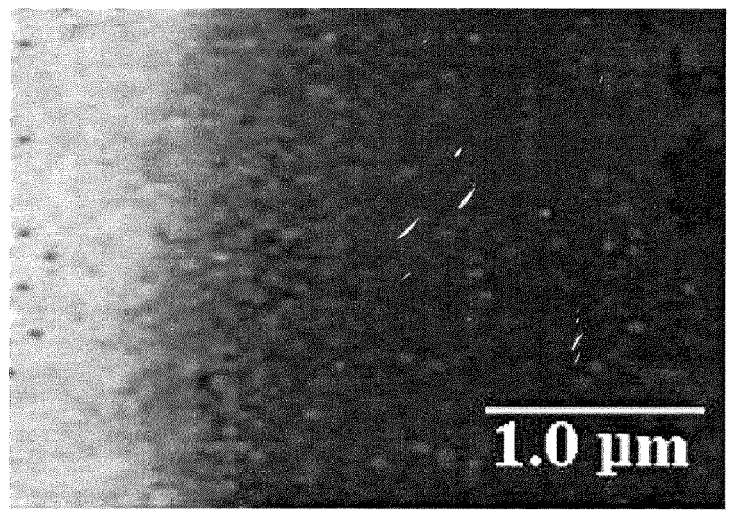
FIG. 8 is a photograph mapping the Si element distribution at the interface of a sample irradiated with an Ar ion beam after coating with SiC.

Meanwhile, FIG. 8 is a photograph mapping the Si element distribution at the interface of a sample irradiated with an Ar ion beam after coating with SiC. As shown in FIG. 8, in the sample irradiated with an Ar ion beam after the coating of SiC, since the Si element, which is indicated in white, is spread toward the base material, the mixing process is determined to have occurred. Since the Si is contained in SiC, it has been found that a SiC coating layer is mixed well with the base material due to the above results.

Experimental Example 4

Experiment on Variation in the Thin Film Deterioration by Heating

A circular SiC thin film having a diameter of 20 mm was deposited on the surface of Hastelloy X, which has a size of 20 mm×20 mm×5 mm and is polished to a surface roughness of 50 nm or less. Next, the thin film was heated in an atmosphere of 900° C. for 1 hour in a state in which testing samples were irradiated with an ion beam, and the other samples were not irradiated with an ion beam. After 1 hour had passed, the surface contours of the samples were observed. The results thereof are shown in FIGS. 9 and 10.

Figure 9:
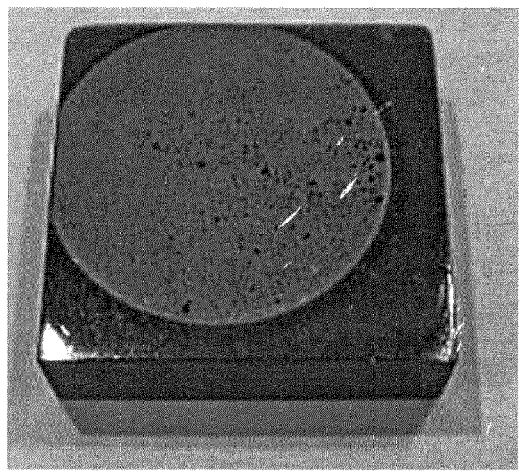
FIG. 9 is a photograph showing the surface contour of a sample that has been thin-coated without radiating an ion beam after the sample is heated according to an embodiment of the present invention.
Figure 10:
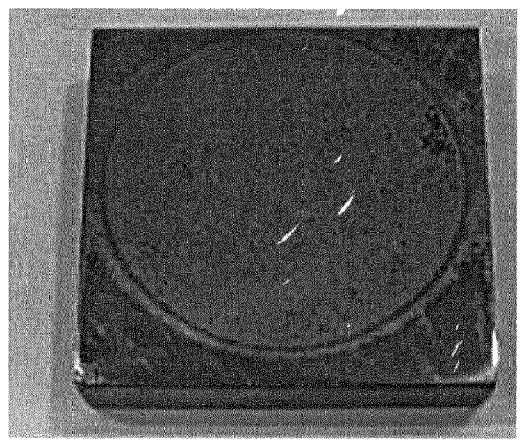
FIG. 10 is a photograph showing the surface contour of a sample that has been thin-coated by radiating an ion beam after the sample has been heated according to an embodiment of the present invention.

Almost no peeling phenomenon occurred in the sample irradiated with an ion beam (see FIG. 10), but the peeling phenomenon occurred to a large extent in the sample that was not irradiated with an ion beam (see FIG. 9). The colors of the sample are changed because the surface of the sample is oxidized. In the sample irradiated with an ion beam, the thin film spread at the corners of the sample.

Experimental Example 5

Electrolytic Etching Experimentation of the SiC Thin Film Coated on Hastelloy X not Irradiated with an Ion Beam A circular SiC thin film having a diameter of 20 mm was deposited on the surface of Hastelloy X, which has a size of 20 mm×20 mm×5 mm and is polished to a surface roughness of 50 nm or less, to a thickness of 550 nm. Next, the thin film was heated to 900° C. for 1 hour and then part of the thin film was electrolytically etched. After the thin film was etched, the surface contours of the samples were observed using an optical microscope. The results thereof are shown in FIG. 11.

Figure 11:
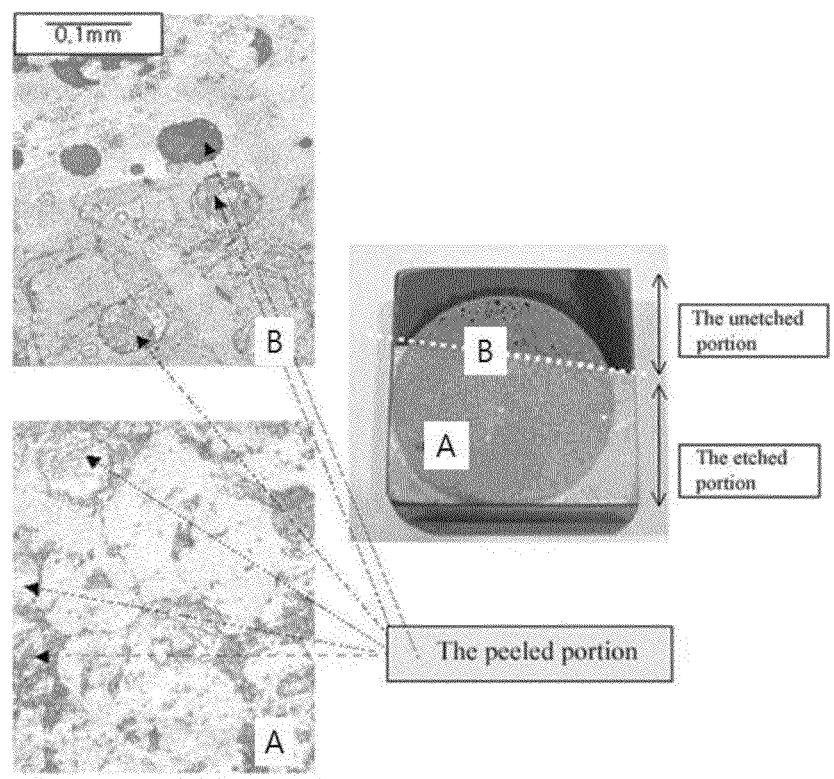
FIG. 11 is a photograph showing a surface contour of a sample that has been thin-coated by radiating an ion beam after the heating and electrolytic etching of the sample according to an embodiment of the present invention.

As shown in FIG. 11, the portion A that peeled off from the coated portion by thermal stress was etched. The portion A that was etched is readibly distinguishable from the portion B that was not etched.

Experimental Example 6

Figure 12:
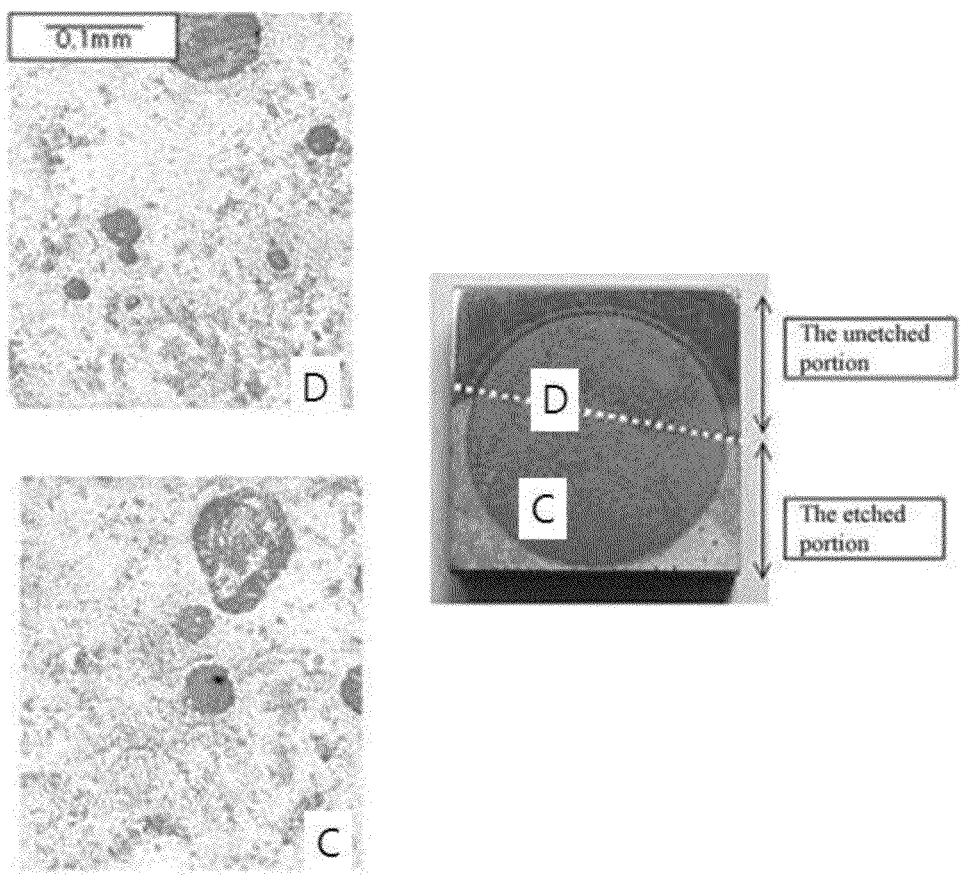
FIG. 12 is a photograph showing a surface contour of a sample that has been thin-coated by radiating an ion beam after the additional thin-coating, heating and electrolytic etching of the sample according to an embodiment of the present invention.

Electrolytic Etching Experiment of the SiC Thin Film Coated on Hastelloy X and Irradiated with an Ion Beam A circular SiC thin film having a diameter of 20 mm was deposited on the surface of Hastelloy X, which has a size of 20 mm×20 mm×5 mm and is polished to a surface roughness of 50 nm or less, to a thickness of 50 nm, a nitrogen ion beam of 70 keV was then radiated thereon, and then additional deposition was conducted to a thickness of 500 nm. Next, as in Experimental Example 5, the thin film was heated at 900° C. for 1 hour and then part of the thin film was electrolytically etched. After the thin film was etched, the surface contours of the samples were observed using an optical microscope. The results thereof are shown in FIG. 12. As shown in FIG. 12, the etched portion C is almost indistinguishable from the unetched portion D, because the partially peeled portion was not well etched either.

Accordingly, when the coating process and the ion beam irradiation process are repeatedly performed, the corrosion resistance can be greatly improved.

INDUSTRIAL APPLICABILITY

In the samples fabricated using the coating and ion beam mixing apparatus, the adhesiveness is improved, and the base material is reinforced, so that the resistance to the thermal stresses at high temperatures and the corrosion-resistance at high temperatures can be improved, therefore the samples can be usefully used in a sulfuric acid decomposition apparatus for producing hydrogen.

What is claimed is:

1. A method of improving adhesiveness and compactness at an interface between a base material and a coating layer using a coating and ion beam mixing apparatus comprising an electron gun disposed in a reaction chamber in a vacuum, a coating material container located adjacent to the electron gun in the reaction chamber and irradiated with an electron beam generated from the electron gun, the base material being secured in an upper portion of the reaction chamber, one surface of which is coated with a coating material melted and vaporized in the coating material container, a jig mounted on another surface of the base material and configured to rotate the base material for uniform deposition of the coating material, and an ion beam irradiation device mounted on a side wall of the reaction chamber and configured to mix the coating material with the base material at the interface therebetween to improve adhesiveness and compactness of the coating layer, comprising:

melting and vaporizing the coating material by radiating the electron beam into the coating material container (step 1);

applying the coating material melted and vaporized in step 1 on the base material to form the coating layer, the coating layer having a thickness ranging from 20 to 200 nm (step 2); and radiating the coating layer with an ion beam at an energy value ranging from 50 to 500 keV to inject ionized atoms into the coating layer at an injection amount ranging from $1\times10^{17}$ to $1\times10^{18}$ ions/cm$^2$ to cause ion beam mixing of the coating material of the coating layer with the base material at the interface (step 3), wherein the coating material is SiC and the base material is Ni—Cr alloys, and wherein after the surface of the base material is completely coated in step 2, the coated base material is rotated by tilting the jig to face an ion beam irradiation inlet in order to expose the coating layer on the base material to the ion beam radiated from the ion beam irradiation device.

2. A method according to claim 1, wherein the energy value and the injection amount of the ion beam are adjusted depending on the thickness of each coating layer applied one time or multiple times.

3. A method according to claim 1, wherein, the element used for the ion beam is an element to form a compound with elements constituting the coating and the base materials.

4. A method according to claim 1, wherein an element used for the ion beam is one selected from the group consisting of carbon, nitrogen, oxygen, silicon, aluminum, helium, neon, argon titanium, or the mixture thereof.

5. A method according to claim 1, further comprising:
   applying one or more additional layers of the coating material melted and vaporized in step 1 or of a second coating material melted and vaporized as in step 1 over the coated surface, each of the one or more additional layers having a thickness ranging from 20 to 200 nm; and
   radiating each of the one or more additional layers with the ion beam at an energy value ranging from 50 to 500 keV to inject ionized atoms into each of the one or more additional layers at an injection amount ranging from $1 \times 10^{17}$ to $1 \times 10^{18}$ ions/cm$^2$,
   wherein after each of said one or more additional layer is applied, the coated surface of the base material is rotated by tilting the jig to face the ion beam irradiation inlet in order to expose the coated surface of the base material to the ion beam radiated from the ion beam irradiation device.

\* \* \* \* \*